United States Patent [19]
Sakamoto et al.

[11] Patent Number: 5,696,443
[45] Date of Patent: Dec. 9, 1997

[54] MAGNETIC RELUCTANCE SENSOR ARRANGEMENT WITH TITLED RELUCTANCE ELEMENT

[75] Inventors: Satoshi Sakamoto; Akihito Nakayama, both of Tokyo, Japan

[73] Assignee: Sony Corporation, Japan

[21] Appl. No.: 490,453

[22] Filed: Jun. 14, 1995

[30] Foreign Application Priority Data

Jun. 17, 1994 [JP] Japan .................... 6-159109

[51] Int. Cl.$^6$ .............. G01B 7/14; G01P 3/42; G01D 5/245; G01R 33/06
[52] U.S. Cl. ............ 324/207.21; 324/207.25; 338/32 R
[58] Field of Search ............ 324/207.21, 207.25, 324/174, 252, 235, 251, 207.24; 338/32 R, 32 H

[56] References Cited

U.S. PATENT DOCUMENTS

| | | | |
|---|---|---|---|
| 4,639,807 | 1/1987 | Sekizawa et al. | 324/207.21 |
| 4,649,342 | 3/1987 | Nakamura | 324/207.21 |
| 4,725,776 | 2/1988 | Onodera et al. | 324/207.21 |
| 5,216,363 | 6/1993 | Masaaki | 324/207.21 |

FOREIGN PATENT DOCUMENTS

50-56250  5/1975  Japan .

*Primary Examiner*—Walter E. Snow
*Attorney, Agent, or Firm*—Ronald P. Kananen

[57] ABSTRACT

A magnetic reluctance sensor can obtain a stable output without causing a curve around the center of an output waveform of an MR output even if the gap between an MR element and an MR magnet is narrowed. A stable output is obtained without causing a curve in an output waveform even if the facing interval "g" between magnet means 2 and a magnetism-sensitive element 3 is decreased, by setting a magnetism-sensitive pattern width "d" of the magnetism-sensitive element 3 to a value 0.3 to 1.0 times larger than a magnetic pole width λ of the magnet means 2.

8 Claims, 14 Drawing Sheets

MAGNETIC RELUCTANCE SENSOR ARRANGEMENT WITH TITLED RELUCTANCE ELEMENT

BACKGROUND OF THE INVENTION

1. Field of the Invention

This invention relates to a magnetic reluctance sensor, which can be applied to an apparatus for detecting a rotational frequency of a rotary drum or the like by using, for example, a magnetic resistance (MR) element.

2. Description of the Related Art

An MR sensor has been used as a frequency generator for detecting a rotational frequency of a rotary drum or the like, as shown in Japanese Patent Publication No. SHO50-56250 published on May 16, 1975. The MR sensor is constituted by arranging an MR magnet comprising a magnet made by magnetizing N and S poles to a rotary drum at equal intervals and an MR element face to face so as to detect a change of a magnetic field caused by the rotation of the rotary drum by the MR element and output an MR output obtained as the result of detecting the magnetic-field change as a frequency signal.

Figure 1A:
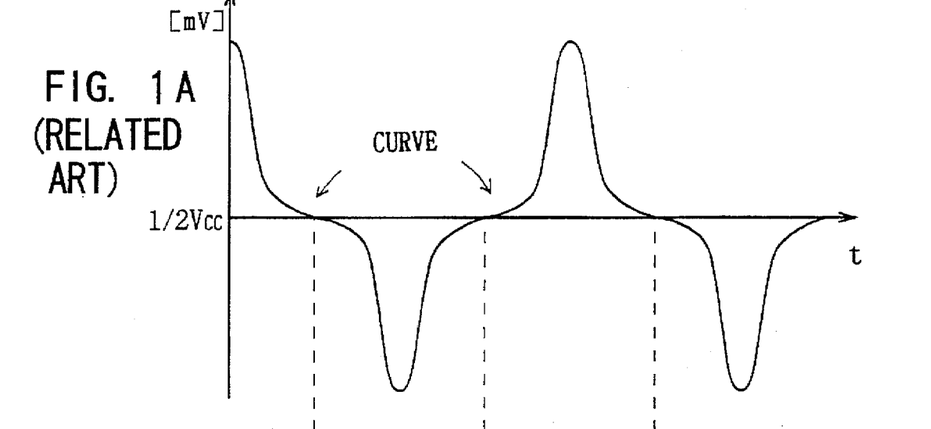
FIGS. 1A and 1B are signal waveform diagrams showing experiment results of curves produced around the center of an MR output detected by an MR sensor.
Figure 1B:
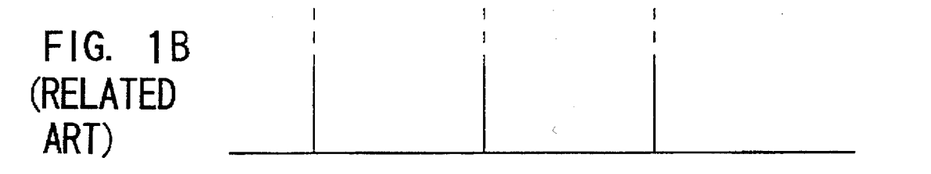

If a gap length between an MR element and an MR magnet is decreased compared to a predetermined gap length due to the part molding accuracy in assembling an MR sensor or a change of the temperature during the operation of the MR sensor, an output waveform around the center of an MR output detected by an electrode of the MR element curves as shown in FIG. 1A. As shown in FIG. 1B, because the MR sensor generates a pulse at the intersection between an MR output and a voltage of ½ of a power supply voltage $V_{CC}$ and uses the pulse as a position signal, a problem occurs that the curve around the center of the output waveform fluctuates with the accuracy of a pulse generating position.

Figure 2:
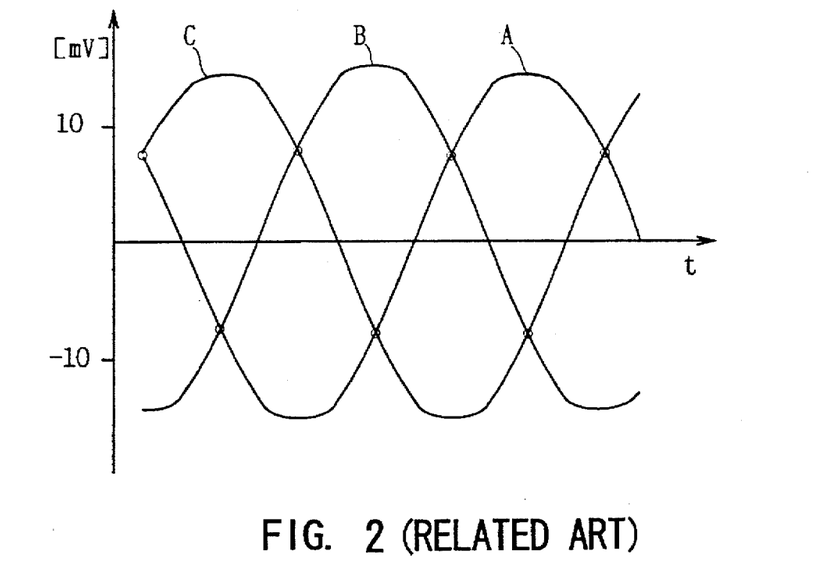
FIG. 2 is a schematic diagram showing an MR output of a three-phase MR sensor.

In particular, when the MR sensor is used as a three-phase MR sensor, a portion between cross points (between circles) of three-phase MR outputs A, B, and C is interpolated by assuming it as a straight line as shown in FIG. 2. Therefore, a problem occurs that the curve of the output waveform around the center of the MR outputs A, B, and C Greatly deteriorates the detection accuracy.

SUMMARY OF THE INVENTION

In view of the foregoing, an object of the invention is to provide a magnetic reluctance sensor making it possible to obtain a stable output by minimizing a curve around the center of the waveform of an MR output even if the gap length between an MR element and an MR magnet decreases.

The foregoing object and other objects of the invention have been achieved by the provision of a magnetic reluctance sensor 1 comprising magnet means 2 obtained by continuously magnetizing a plurality of N poles and a plurality of S poles with a predetermined magnetic pole width λ at equal intervals and a magnetic reluctance element 3 which are arranged face to face to detect a change of a magnetic field due to a change of the relative position between the magnet means 2 and the magnetic reluctance element 3 by the magnetic reluctance element 3 and output the change as a voltage change, in which the magnetic reluctance element 3 series-connects first and second magnetism-sensitive sections 3A and 3B constituted by arranging basic magnetism-sensitive patterns which extend in a direction "b" radiating to the arrangement direction "a" of the N and S poles of the magnet means 2 and on which a folded zonal pattern of the magnetic reluctance element 3 having a magnetism-sensitive pattern width "d" 0.3 to 1.0 times larger than a magnetic pole width λ is formed in the arrangement direction "a" of the N and S poles at an interval of ½ the magnetic pole width λ in the arrangement direction "a" of the magnet means 2, applies a DC voltage to the both ends 4 and 5 of the first and second magnetism-sensitive sections, and uses the connection point between the first and the second magnetism-sensitive sections 3A and 3B as an output terminal 6.

By setting the magnetism-sensitive pattern width "d" of the magnetic reluctance element 3 to a value 0.3 to 1.0 times larger than the magnetic pole width λ of the magnet means 2, it is possible to obtain an stable output in which an output waveform does not curve even if the facing interval or gap "g" between the magnet means 2 and the magnetic reluctance element 3 is decreased.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Figure 3A:
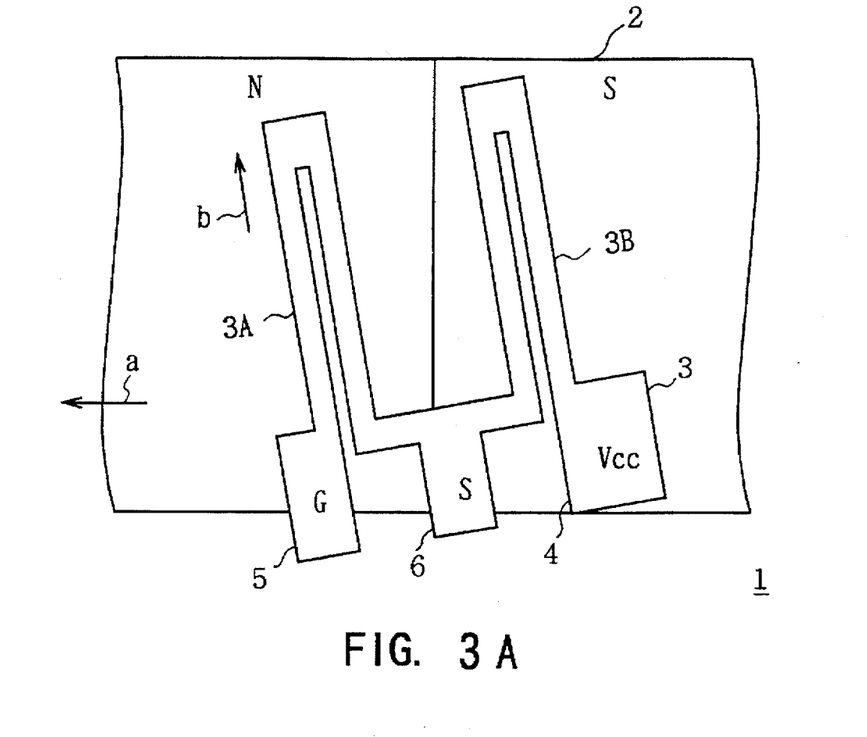
FIGS. 3A and 3B are schematic diagrams showing the magnetic reluctance sensor of an embodiment of this invention.
Figure 3B:
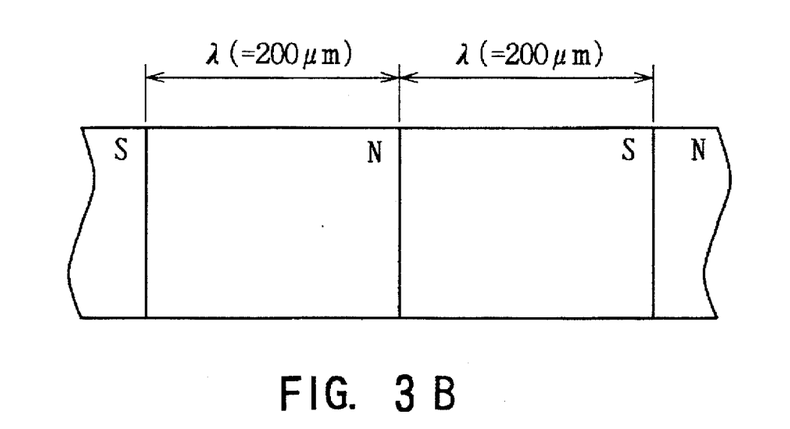

Preferred embodiments of this invention will be described with reference to the accompanying drawings:

In FIG. 3A, reference numeral 1 denotes an MR sensor as a whole in which an MR element 3 is arranged with an MR magnet 2 constituted by magnetizing N and S poles with the magnetic pole width $\lambda$ (See FIG. 3B) respectively, at equal intervals so that they face each other. The MR element 3 is formed by series-connecting two rectangular zonal basic magnetism-sensitive patterns 3A and 3B. The rectangular portions of the basic magnetism-sensitive patterns 3A and 3B are folded so that the patterns become parallel each other and the interval between the center lines is set to a value ½ the magnetic pole width $\lambda$ of the MR magnet 2.

A power-supply voltage $V_{CC}$ terminal 4 and a grounding terminal 5 are formed on the both ends of the MR element 3 respectively and an output terminal 6 is formed at the middle point between the power-supply voltage $V_{CC}$ terminal 4 and the grounding terminal 5. In the MR sensor 1, the direction or orientation of the MR element 3 shown by the arrow "b" is tilted by a predetermined angle to the direction in which the N and S magnetic poles of the MR magnet 2 are arranged shown by the arrow "a") from the state where the direction of the MR element 3 is perpendicular to the arrangement direction of the N and S poles and arranged while maintaining a predetermined gap width "g" (facing interval between the magnet 2 and the magnetic resistance element 3). The MR sensor 1 applies the power-supply voltage $V_{CC}$ to the MR element 3, moves the MR magnet 2 relatively to the MR element 3, detects a change of a magnetic field generated due to the relative movement of the MR magnet 2, and outputs the change as an MR output $V_{MR}$ from the output terminal 6.

Figure 4A:
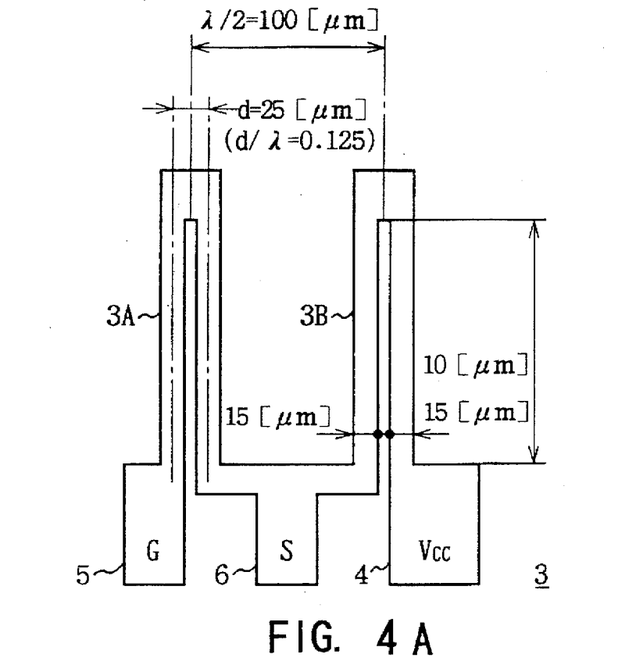
FIGS. 4A and 4B are schematic diagrams showing an MR element.
Figure 4B:
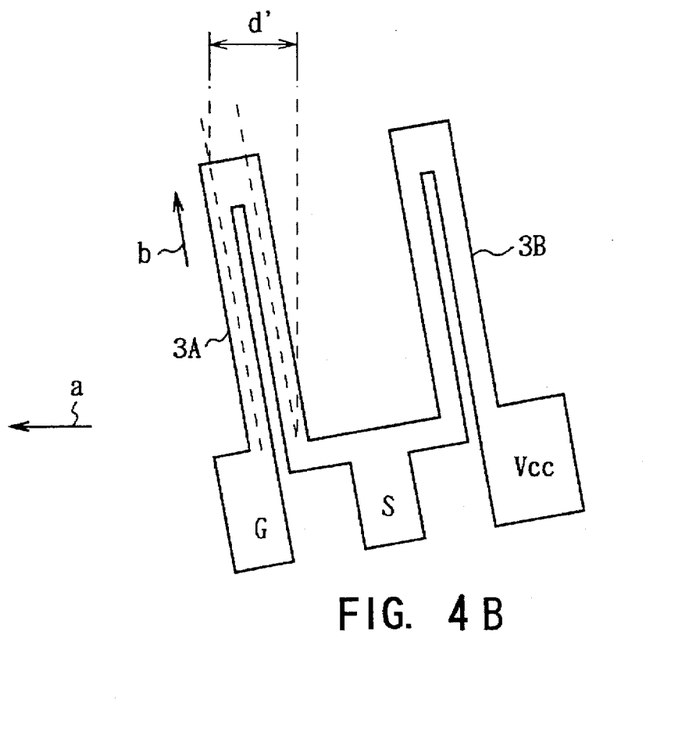

The basic magnetism-sensitive pattern width "d" of the MR element 3 is, as shown in FIGS. 4A and 4B, set to a value equal to the distance between the centers of the rectangular pattern widths of the basic magnetism-sensitive patterns 3A and 3B, therefore, "d" comes to 25 [μm]. Moreover, in this embodiment, because the magnetic pole width $\lambda$ equals 200 [μm], the distance between the centers of the basic magnetism-sensitive patterns 3A and 3B is set to 100 [μm] which is ½ the magnetic pole width $\lambda$.

In this case, by changing the angle formed between the extending direction "b" of the MR element 3 and the arrangement direction "a" of the magnetic poles of the MR magnet 2 from the perpendicular state, the basic magnetism-sensitive pattern width "d" is changed to "d" correspondingly to a change of the angle tilted from the perpendicular state between the directions "a" and "b" (See FIG. 4B). That is, the basic magnetism-sensitive pattern width "d" becomes a crossing width of the basic magnetism-sensitive patterns 3A and 3B in the direction parallel with the arrangement direction "a" of the magnetic poles of the MR magnet 2. Thus, an MR output can be changed by changing the basic magnetism-sensitive pattern width "d" and resultantly changing the ratio d/$\lambda$ between the basic magnetism-sensitive pattern width "d" and the magnetic pole width $\lambda$.

Figure 5A:
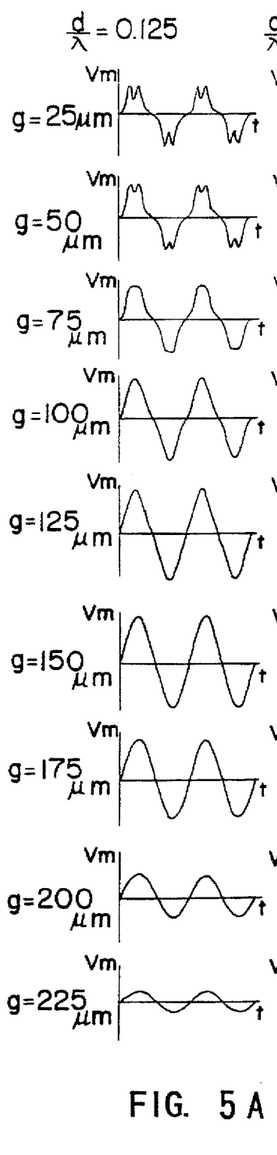
FIGS. 5A to 5D are signal waveform diagrams showing experiment results of magnetism-sensitive pattern widths of an MR element and curves produced around the center of an MR output.

In the above arrangement, when the direction "a" of the MR magnet 2 is perpendicular to the direction "b" of the MR element 3 as shown in FIG. 5A, it is observed that the center of the waveform of the MR output $V_{MR}$ is curved. The curve is observed when the gap length "g" between the MR element 3 and the MR magnet 2 ranges from 25 to 100 [μm]. In this case, the ratio d/$\lambda$ of the magnetism-sensitive pattern width "d" to the magnetic pole width $\lambda$ equals to 0.125.

Figure 5B:
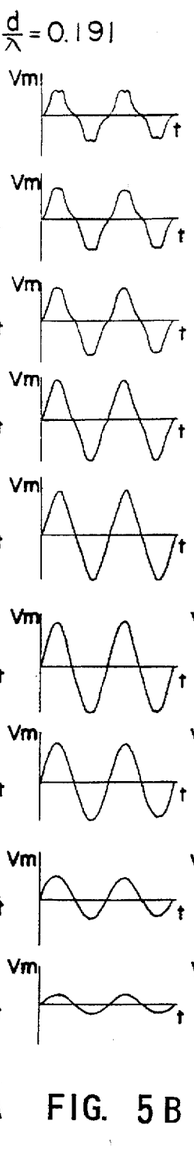
Figure 5C:
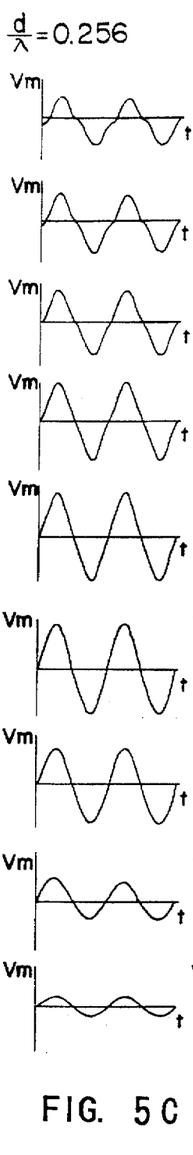
Figure 5D:
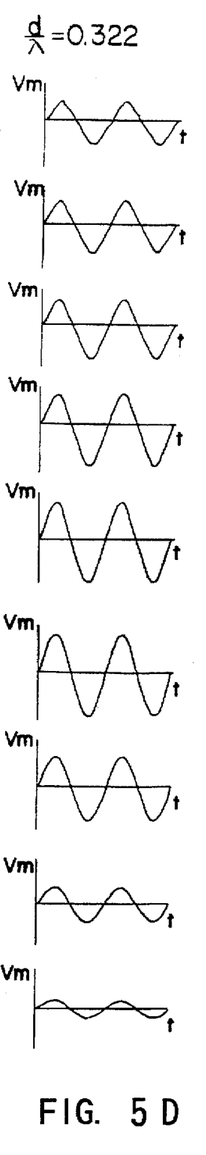
Figure 6A:
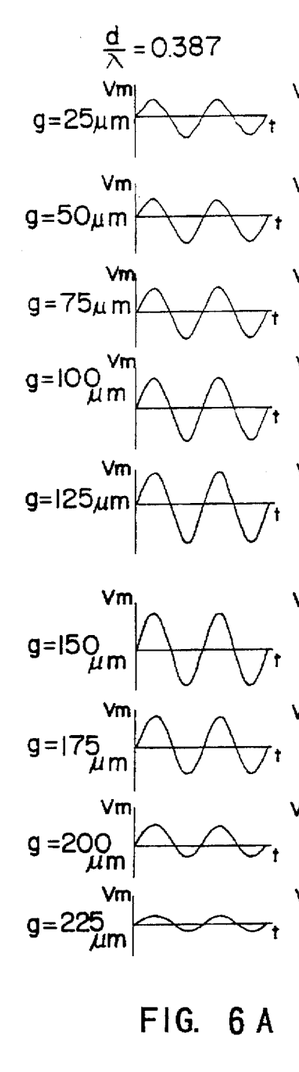
FIGS. 6A to 6D are signal waveform diagrams showing experiment results of magnetism-sensitive pattern widths of an MR element and curves produced around the center of an MR output.
Figure 6B:
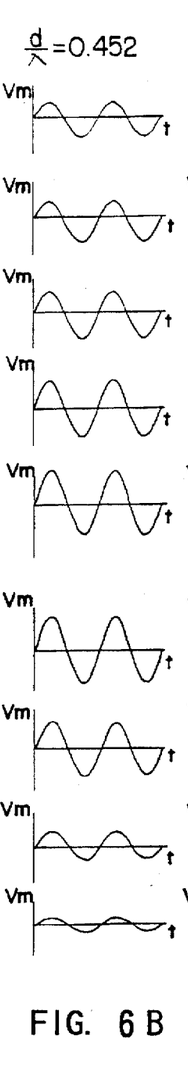
Figure 6C:
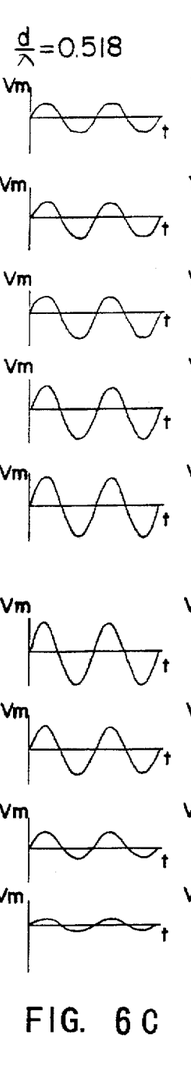
Figure 6D:
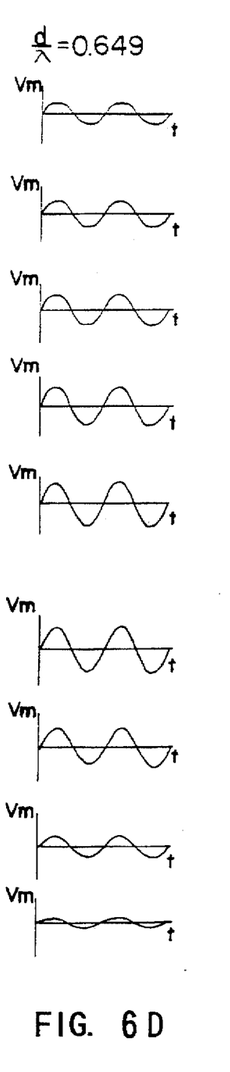
Figure 7A:
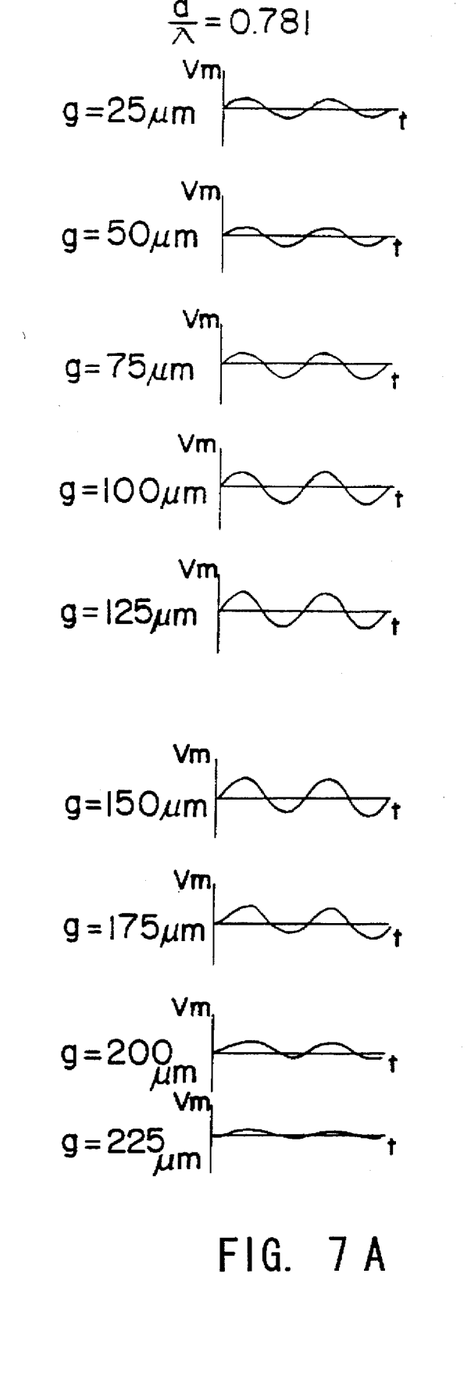
FIGS. 7A and 7B are signal waveform diagrams showing experiment results of magnetism-sensitive pattern widths of an MR element and curves produced around the center of an MR output.
Figure 7B:
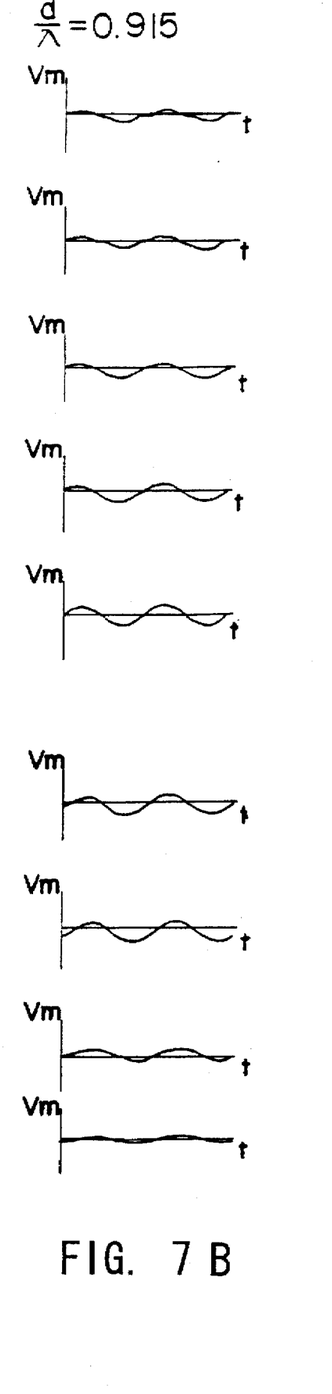

Then, the arrangement direction "b" of the MR element 3 is tilted to the arrangement direction "a" of the poles of the MR magnet 2 from the perpendicular state to increase the basic magnetism-sensitive pattern width "d". In this case, the relation between the ratio d/$\lambda$ and the MR output $V_{MR}$ is expressed as d/$\lambda$=0.191 (FIG. 5B), d/$\lambda$=0.256 (FIG. 5C) and d/$\lambda$=0.322 (FIG. 5D) and it is observed that the degree of the curve of the output waveform at the center of the MR output $V_{MR}$ decreases as the ratio d/$\lambda$ increases.

When d/$\lambda$ is set to 0.125 without tilting the basic magnetism-sensitive pattern width "d", it is confirmed that the curve of the output waveform at the center of the MR output $V_{MR}$ observed for the gap length "g" of 25 to 100 [μm] is hardly observed for d/$\lambda$=0.256 when tilting the MR element 3, and moreover it is not observed for d/$\lambda$=0.322 even for the gap length "g" of 25 [μm]. Moreover, it is confirmed that the curve does not appear even if d/$\lambda$ is further increased (FIGS. 6A to 6D, 7A and 7B). Therefore, it is found by setting the basic magnetism-sensitive pattern width "d" to 0.3$\lambda$ or more that no curve occurs in the MR output $V_{MR}$ even if the gap length "g" decreases and the accurate MR element 3 can be realized.

Figure 8:
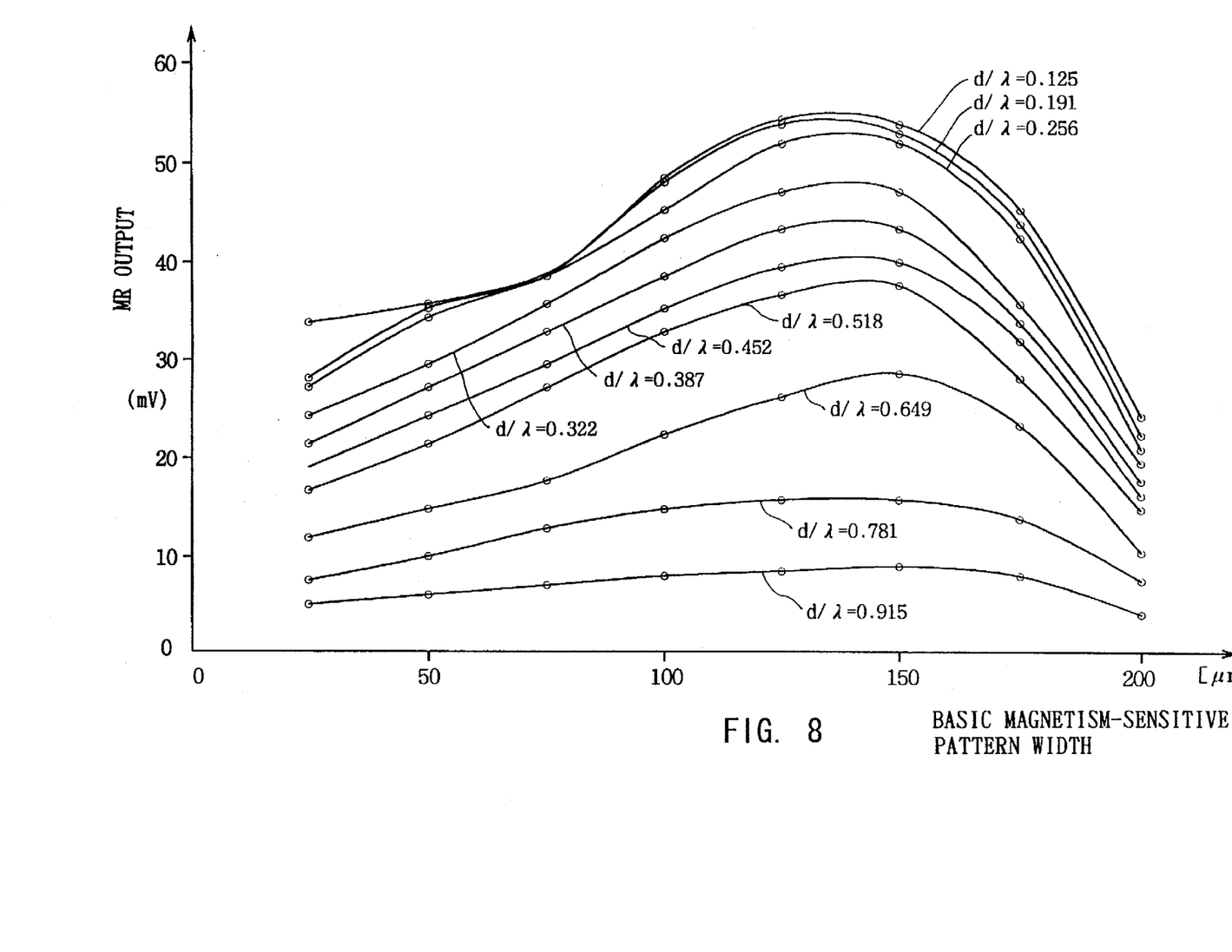
FIG. 8 is an output diagram showing experiment results of magnetism-sensitive pattern widths of an MR element and MR outputs.

Moreover, by further tilting the MR element 3 and increasing the ratio d/$\lambda$ by increasing the basic magnetism-sensitive pattern width "d", it is observed that the MR output $V_{MR}$ decreases as d/$\lambda$ increases as shown in FIG. 8. In this case, because the MR output $V_{MR}$ comes to almost zero for d/$\lambda$=1, it is found that no curve is present in an output waveform around the center and the range of d/$\lambda$ making it possible to detect the MR output $V_{MR}$ is between 0.3 $\leq$d/$\lambda$<1. In this case, the optimum value of d/$\lambda$ can be determined as approximately 0.3 because the MR output $V_{MR}$ becomes more advantageous in view of S/N ratio as it increases.

According to the above constitution, when the gap width "g" between the MR element 3 and the MR magnet 2 decreases and a curve appears in the output waveform at the center of the MR output $V_{MR}$, it is possible to realize an MR sensor with a high accuracy of which the curve of a waveform around the center of the MR output $V_{MR}$ is little even if the gap width "g" is small, by tilting the MR element 3 facing the MR magnet 2 and in order to increase the basic magnetism-sensitive pattern width "d" and set the ratio d/$\lambda$ between the basic magnetism-sensitive pattern width d and the magnetic pole width $\lambda$ to approximately 0.3.

Figure 9A:
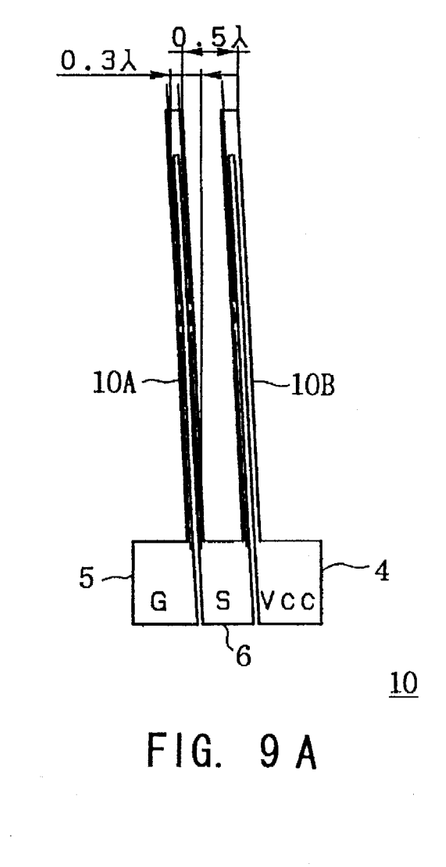
FIGS. 9A to 9C are schematic diagrams showing a modification (1) of a magnetism-sensitive pattern of an MR element.

In the above embodiment, the whole MR element 3 is tilted to increase the basic magnetism-sensitive pattern width "d". However, this invention is not only limited to this, but may tilt only the portions 10A and 10B of the magnetism-sensitive pattern of the MR element 10 as shown in FIG. 9A.

Figure 10:
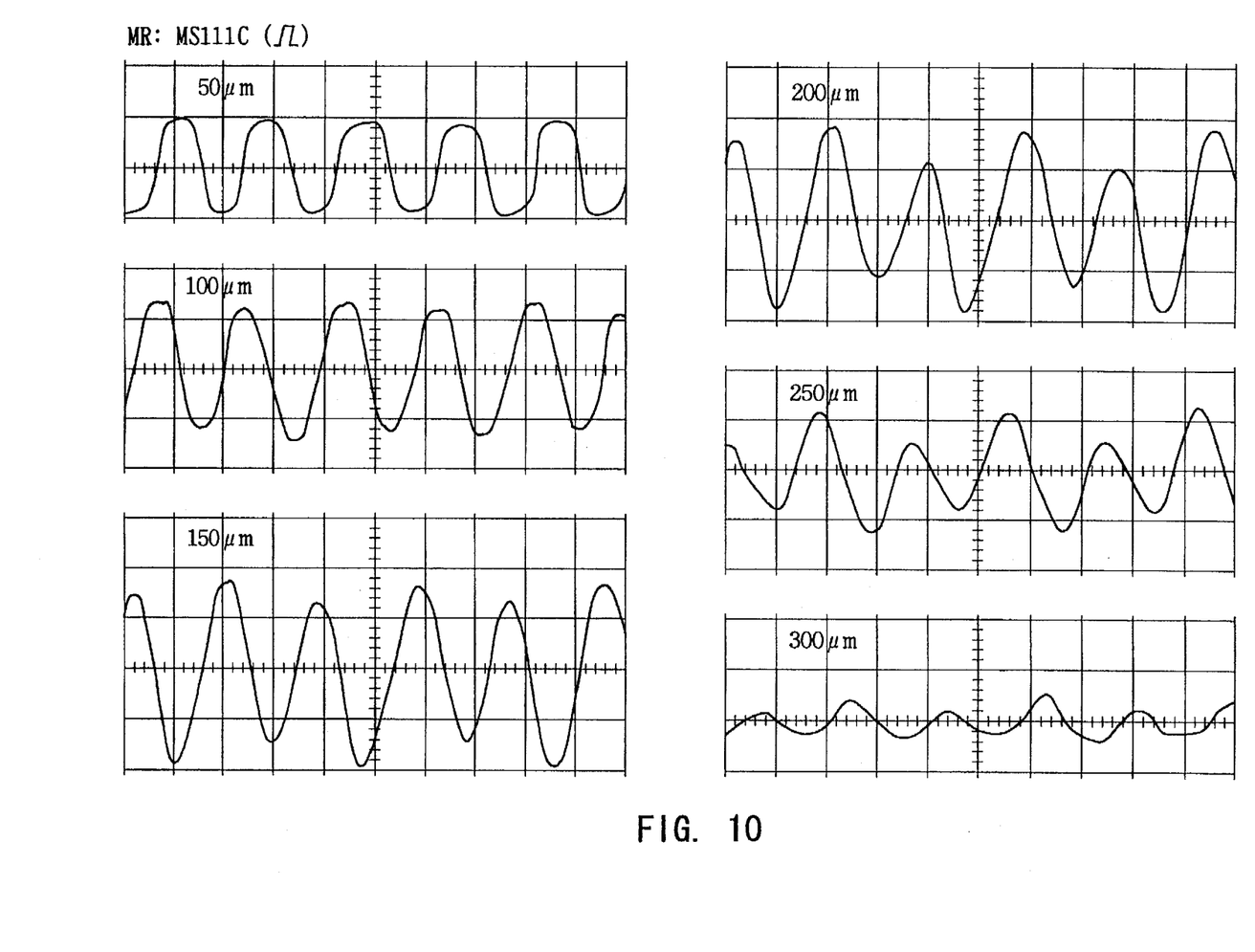
FIGS. 10 and 11 are signal waveform diagrams showing the relation between gap length of an MR magnet and a tilting MR element and MR output.
Figure 11:
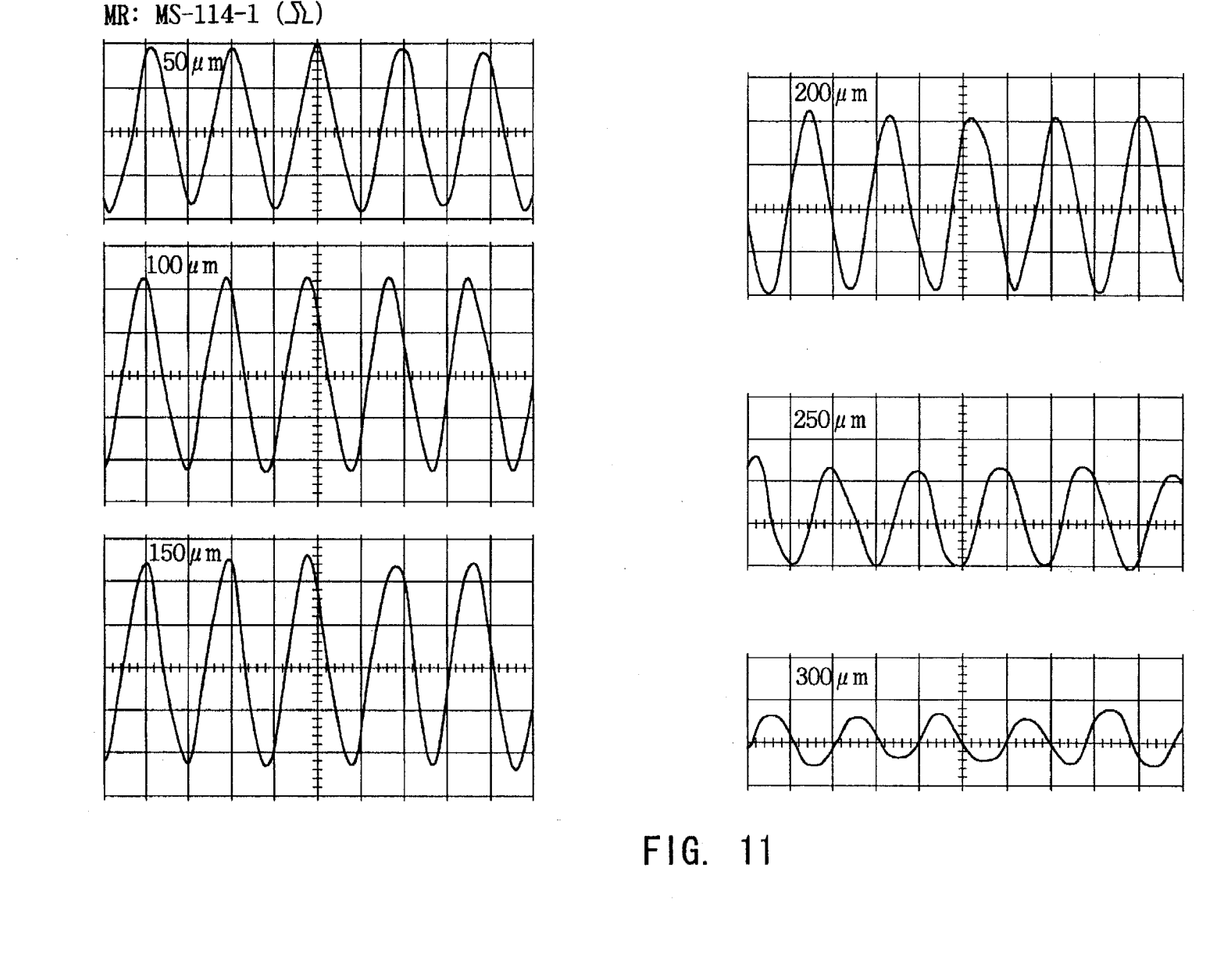

FIGS. 10 and 11 show the relation of the gap length "g" between the MR magnet and the MR sensor, MR output, and AM fluctuation, regarding the MR sensor in d/$\lambda$=0.3.

Here, the AM fluctuation is the ratio of the maximum amplitude "m" and the minimum amplitude "n" in FIGS. 10 and 11 showing the MR output. For example, in FIG. 10, when g=150 [μm], n/m is approximately 79[%].

Figure 12:
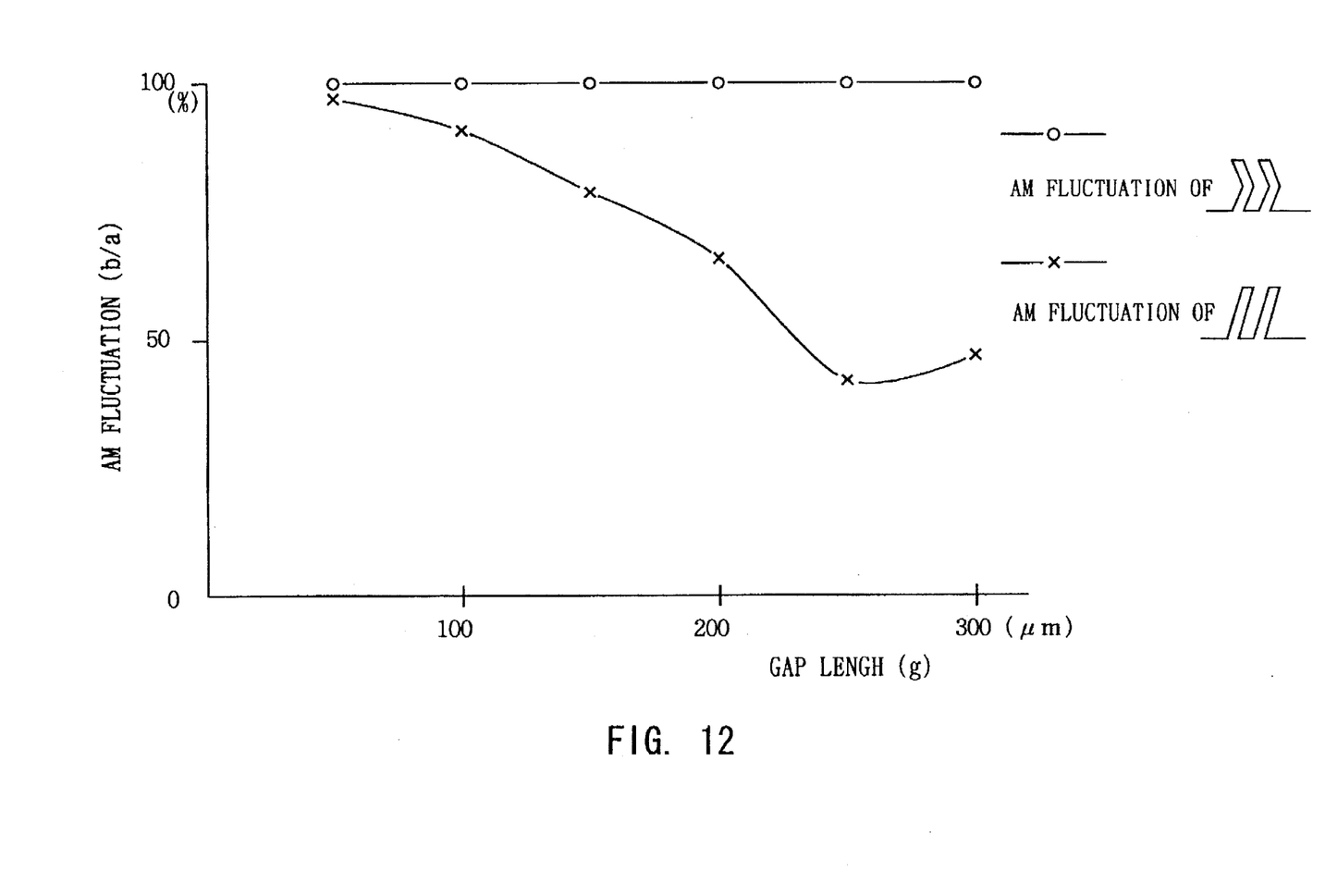
FIG. 12 is a graphic chart showing the relation between gap length of an MR magnet and an MR element and AM fluctuation.

Therefore, it can be confirmed in FIG. 12 that the AM fluctuation is not good only if the MR element is tilted by the predetermined angle from the perpendicular state to the arrangement direction "a" of the magnetic pole.

Hereinafter, this reason will be considered.

Figure 13A:
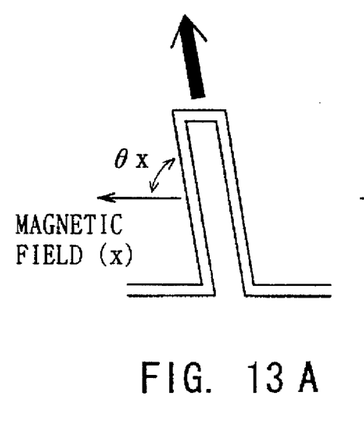
FIG. 13 comprised on FIGS. 13A and 13B is a schematic diagram explaining magnetizing direction of a tilting MR element.
Figure 13B:
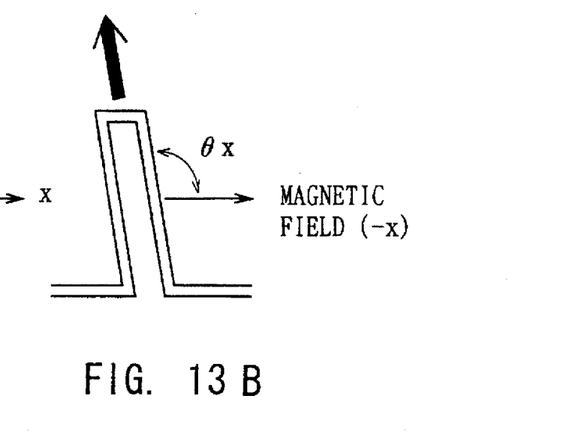

In the magnetism-sensitive patterns of the MR sensor, since the pattern length direction is the easily magnetizing direction, the magnetization vector must face in the direction of the bold arrow shown in FIGS. 13A and 13B or in the opposite direction (viz., 180° to the bold arrow direction). Here, it is assumed that the magnetization vector is oriented in the bold arrow direction in FIGS. 13A and 13B.

Since the magnetic field of the MR magnet is generated in the direction of xz-plane (z-axis is the vertical direction to paper), as shown in FIGS. 13A and 13B, when the magnetic field −X or X is added to the magnetism-sensitive patterns, $\theta_{-x}$, $\theta_x$ differ in angle twice the angle that the magnetism-sensitive patterns is tilted. The MR sensor can obtain the signal of one cycle in the movement of one magnetic pole, and the output level differs for every cycle. This is the AM fluctuation.

Figure 14A:
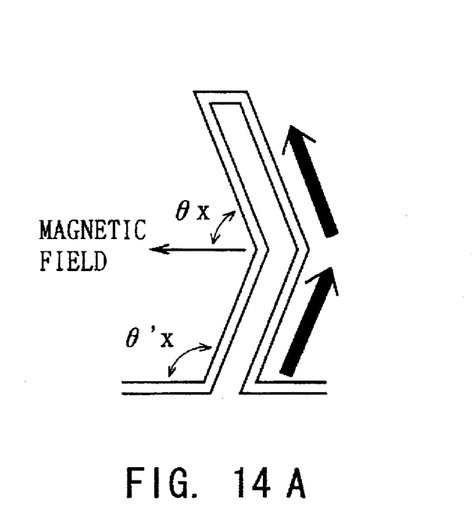
FIG. 14 comprised of FIGS. 14A and 14B is a schematic diagram explaining magnetizing direction of an MR element having boomerang shape.
Figure 14B:
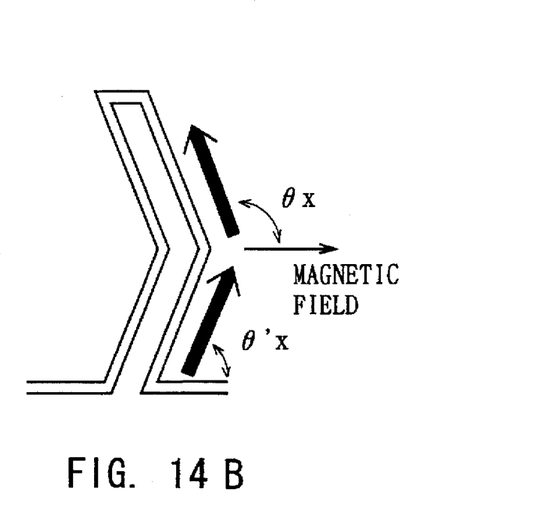

To eliminate this AM fluctuation, the magnetism-sensitive patterns are bent to a boomerang shape. Thereby, the angle of the magnetic field and the magnetization vector becomes $(\theta_x+\theta'_x)/2$, and the AM fluctuation is not bad because the magnetic field can be inverted by 180[°] from X to −X (See FIGS. 14A and 14B).

Figure 9B:
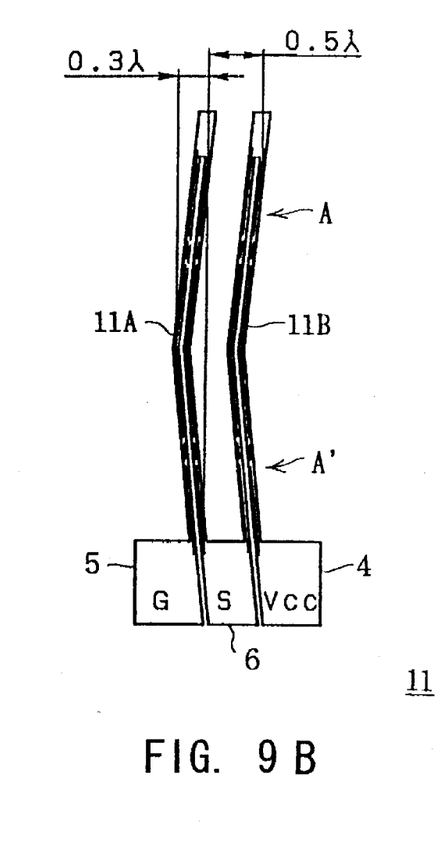
Figure 9C:
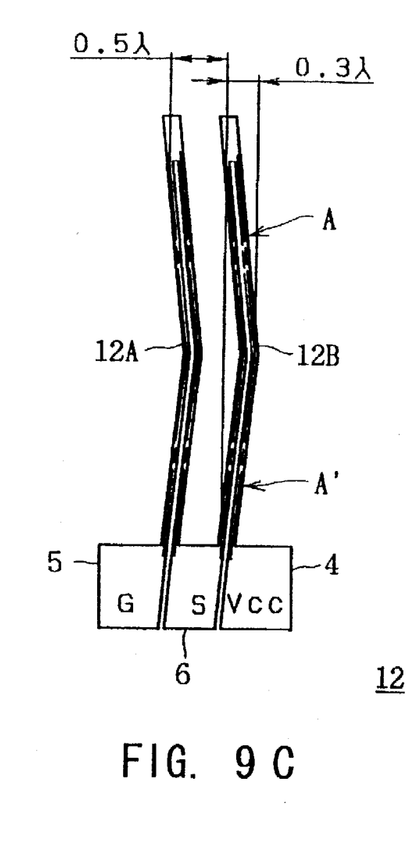

Moreover, in the above embodiments, the basic magnetism-sensitive pattern width "d" is increased by tilting a straight basic magnetism-sensitive pattern and d/λ is set to approximately 0.3. However, this invention is not only limited to this, but, as shown in FIGS. 9B and 9C, the rectangular portions 11A and 11B or 12A and 12B of MR elements 11 and 12 are bent to a boomerang shape or the shape of the Japanese character "<(ku)" (in FIGS. 7A and 7B, the straight line from the magnetism-sensitive pattern extension starting point 7 to the end point 9 intersects orthogonally to the arrangement direction "a" of magnetic pole, and it is bent at an almost center point 8 of the magnetism-sensitive pattern with the predetermined angle), and the arrangement direction "b" of an MR element 11 provided with an azimuth and the arrangement direction "a" of the magnetic poles of an MR magnet diagonally intersect each other, the basic magnetism-sensitive pattern width "d" of the MR element 11 or 12 can be increased and d/λ can be set to approximately 0.3. In addition, the directions "a" and "b" are intersected orthogonally and the basic magnetism-sensitive pattern width "d" can be simply set to the width of 0.3λ.

In this connection, the boomerang direction of a basic magnetism-sensitive pattern can be set rightward or leftward and therefore, it is possible to set a leftward-tilted boomerang pattern and a rightward-tilted boomerang pattern. In this case, it is necessary to set the leftward-tilted and rightward-tilted boomerang patterns so that the lengths of them are almost equal. In this case, even if an error occurs in the parallelism between an MR magnet and a magnetism-sensitive pattern (the angle of inclination from the perpendicular state to the "a" direction of magnetism-sensitive pattern ("b" direction)) by bending a rectangular portion like a boomerang, an MR sensor stable to an angular error can be realized because the MR output $V_{MR}$ at the portion A' decreases when the MR output $V_{MR}$ at the portion A increases. Thereby, the MR output $V_{MR}$ does not fluctuate even if an error occurs in the parallelism between an MR magnet and an MR element. In addition, if the magnetic resistance is equal in the upper part and the lower part of the center point 9 (FIGS. 9A to 9C), it is not necessary to be in the relationship of $\theta_x+\theta_x'=180[°]$. That is, the magnetism-sensitive patterns are not needed to be the symmetry shape. Also, the point to bend to a boomerang shape is not needed to be the center point of the magnetism-sensitive pattern.

Figure 15A:
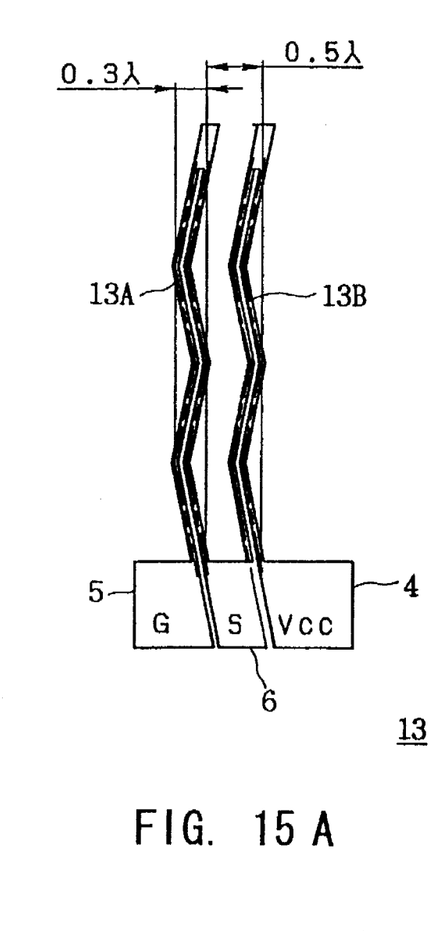
FIGS. 15A and 15B are schematic diagrams showing a modification (2) of a magnetism-sensitive pattern of an MR element.
Figure 15B:
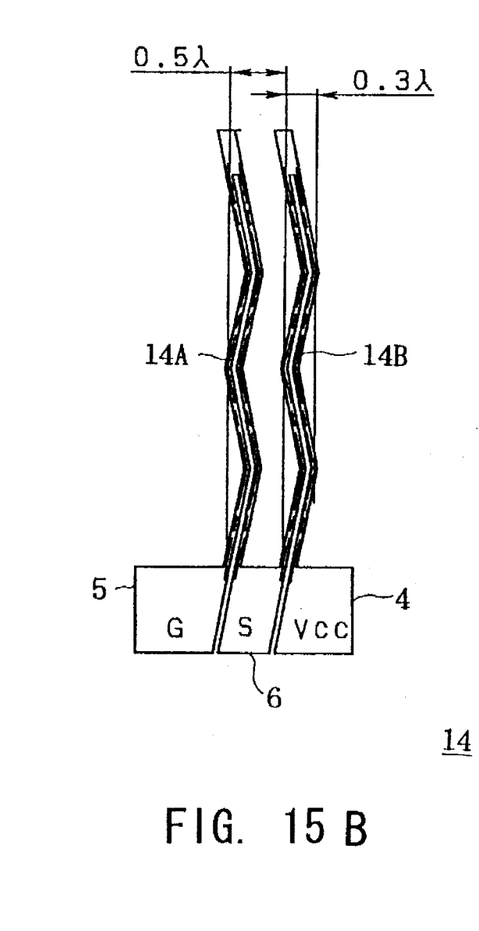

Moreover, as shown in FIGS. 15A and 15B, it is possible to bend the rectangular portions of basic magnetism-sensitive patterns 13A and 13B or 14A and 14B of MR elements 13 and 14 like a boomerang not only once but also twice or more. FIGS. 15A and 15B show the pattern of letter M (or letter W).

Figure 16:
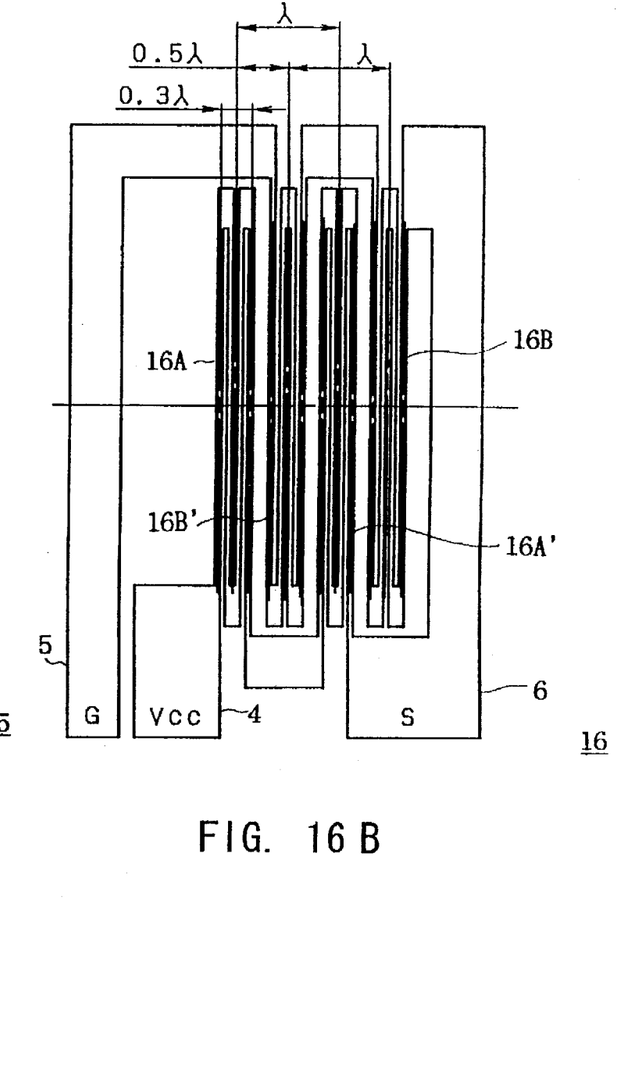
FIGS. 16A and 16B are schematic diagrams showing a modification (3) of a magnetism-sensitive pattern of an MR element.

Furthermore, in the above embodiments, the direction of an MR element is tilted to the magnetic-pole arrangement direction "a" of the MR magnet 2 in order to increase a magnetism-sensitive pattern width. However, this invention is not only limited to this, but, for example, as shown in FIGS. 16A and 16B, it is possible to increase the number of times for folding rectangles of magnetism-sensitive patterns 15A and 15B or 16A and 16B of MR elements 15 and 16 facing an MR magnet along the arrangement direction "a" of magnetic poles of the MR magnet and also increase the area of a magnetism-sensitive pattern of a facing MR element.

Furthermore, in the above embodiments, a pair of basic magnetism-sensitive patterns are connected in series and an output terminal is formed at the middle point of them. However, this invention is not only limited to this, but may connect a plurality of basic magnetism-sensitive pattern pairs connected in series at positions separated each other by a distance integer times larger than λ. In this case, because a plurality of output terminals are also necessary, the power consumption can be reduced compared to the case of using only one pair of basic magnetism-sensitive patterns.

Furthermore, in the above embodiments, this invention is applied to a monophase MR sensor. However, this invention is not only limited to this. By applying this invention to a two-phase, three-phase, or polyphase MR sensor, the linearity around the center of an output is improved and the detection accuracy can further be improved.

Furthermore, in the above embodiments, an MR magnet comprising a rotary drum is rotated to change a relative position between the MR magnet and an MR element. However, this invention is not only limited to this, but may detect a change of a magnetic field from a relative-position change according to a linear motion as in, for example, a linear motor. Moreover, it is possible that either MR magnet or MR element changes its position because a positional change between the MR magnet and the MR element is relative.

While there has been described in connection with the preferred embodiments of the invention, it will be obvious o those skilled in the art that various changes and modifications may be aimed, therefore, to cover in the appended claims all such changes and modifications as fall within the true spirit and scope of the invention.

What is claimed is:

1. A magnetic reluctance sensor arrangement comprising:
    magnet means including a row of magnets having equidistantly spaced alternating N poles and S poles which are separated with a predetermined magnetic-pole width and which extend in a predetermined arrangement direction; and
    a magnetic reluctance element which is arranged in a face-to-face relatively movable relationship with the magnetic means to detect a change in a magnetic field due to a change of the relative position between said magnet means and the magnetic reluctance element and output the detected change as a voltage change, said magnetic reluctance element including two rectangular magnetism-sensitive patterns, having a combined width 0.3 to 1.0 times larger than the magnetic pole width in an arrangement direction of the N and S poles, the two rectangular magnetism-sensitive patterns of said magnetic reluctance element being arranged at a predetermined acute angle across the arrangement direction of said N and S poles and so that a gap between the two rectangular magnetism-sensitive patterns and the row of magnets of said magnet means, is essentially constant.

2. The magnetic reluctance sensor arrangement according to claim 1, wherein the two rectangular magnetism-sensitive patterns of the magnetic reluctance element comprise said magnetic reluctance element are separated by an interval of ½ said magnetic pole width, and are connected in series between a power-supply terminal and a grounding terminal, said magnetic reluctance element further comprising a single output terminal formed between the power supply terminal and the grounding terminal and between the two rectangular magnetism sensitive patterns, the voltage appearing on the output terminal indicating the relative movement between the plurality of N and S poles and said magnetic reluctance sensor.

3. A magnetic reluctance sensor arrangement comprising:
a row of magnets having equidistantly spaced alternating N poles and S poles which are separated with a predetermined magnetic-pole width and which extend in a predetermined arrangement direction; and
a magnetic reluctance sensor which is arranged in a face-to-face relatively movable relationship with said row of magnets, said reluctance sensor being arranged at a predetermined acute angle across the arrangement direction of the N and S poles and so that a gap between the magnetic reluctance sensor and the row of magnets, is essentially constant, said magnetic reluctance sensor comprising:
a power-supply voltage terminal;
a grounding terminal to which a DC voltage is applied;
two rectangular magnetic-sensitive patterns serially interconnecting said power-supply terminal and said grounding terminal; and
a single output terminal, said output terminal being connected in series with said power-supply terminal and said grounding terminal and arranged between two rectangular magnetic-sensitive patterns so that a voltage appearing on said output terminal indicates movement of the plurality of N and S poles past said magnetic reluctance sensor.

4. The magnetic reluctance sensor arrangement according to claim 2, wherein in said magnetic reluctance element, only the magnetism-sensitive pattern portions are tilted by a predetermined angle with respect to portions which comprise the power-supply terminal, the grounding terminal, and the output terminal.

5. A magnetic reluctance sensor comprising:
magnet means constituted by continuously magnetizing a plurality of N poles and a plurality of S poles with a predetermined magnetic-pole width at equal intervals; and a magnetic reluctance element which is arranged in a face to face relationship with said magnet means to detect a change of a magnetic field due to a change of the relative position between said magnet means and the magnetic reluctance element and output the change as a voltage change, wherein:
said magnetic reluctance element extends in a direction radiating to the arrangement direction of the N and S poles of said magnet means, and has a magnetism-sensitive pattern width 0.3 to 1.0 times larger than said magnetic pole width in the arrangement direction of said N and S poles, and wherein:
in said magnetic reluctance element, the magnetism-sensitive pattern is tilted by a first angle from the perpendicular state in the arrangement direction of said N and S poles and is tilted by a second angle which is in the opposite direction to said first angle at the predetermined position of said magnetism-sensitive pattern.

6. The magnetic reluctance sensor according to claim 5, wherein
in said magnetism-sensitive pattern, the magnetic reluctance is equal between the upper part and the lower part at the predetermined position which is bent by said second angle.

7. A magnetic reluctance sensor arrangement comprising:
a magnet array wherein a series of magnets are arranged in an aligned row and in a manner to provide alternatively arranged equal width north and south pole segments; and
a sensor element disposed in a predetermined spaced relatively movable relationship with said magnetic array, said sensor element having magnet-sensitive pattern means oriented at a predetermined acute angle across the aligned row of magnets and in a manner which maintains an essentially uniform gap width between said sensor element and the aligned row of magnets, said sensor element detecting relative movement between said magnet array and said sensor element, and being so configured and arranged that the magnetic-sensitive pattern is half as wide as a width of one of the north and south pole segments, said magnet-sensitive pattern including a power-supply terminal, a ground terminal and a single output terminal which is connected in series with the power-supply terminal and the ground terminal, said output terminal exhibiting a voltage which is indicative of relative movement between said magnet array and said second element.

8. A magnetic reluctance sensor according to claim 7, wherein said sensor element is configured so as to extend at first and second predetermined angles with respect to the aligned row of magnets.

* * * * *